United States Patent
Yoo et al.

(10) Patent No.: US 6,318,437 B1
(45) Date of Patent: Nov. 20, 2001

(54) TAPE FEEDER FOR COMPONENT PART MOUNTER

(75) Inventors: Dong-hee Yoo; Byung-ho Chang, both of Changwon (KR)

(73) Assignee: Samsung Aerospace Industries, Ltd., Kyongsangman-do (KR)

( * ) Notice: Subject to any disclaimer, the term of this patent is extended or adjusted under 35 U.S.C. 154(b) by 0 days.

(21) Appl. No.: 09/349,937

(22) Filed: Jul. 8, 1999

(30) Foreign Application Priority Data

Jul. 9, 1998 (KR) .................................................. 98-27653
Jun. 24, 1999 (KR) .................................................. 99-23943

(51) Int. Cl.[7] ..................................................... B65H 5/28
(52) U.S. Cl. ........................... 156/584; 156/344; 221/25; 221/79; 221/87; 414/411; 414/416
(58) Field of Search ..................................... 156/344, 584; 221/25, 72, 73, 79, 87; 226/8, 120, 139; 414/411, 416, 425

(56) References Cited

U.S. PATENT DOCUMENTS

| | | | |
|---|---|---|---|
| 3,733,075 | * 5/1973 | Hooker et al. | 273/141 A |
| 3,919,715 | * 11/1975 | Galloway et al. | 360/6 |
| 4,190,359 | * 2/1980 | Murayama et al. | 355/75 |
| 5,725,140 | * 3/1998 | Weber et al. | 414/416 X |

\* cited by examiner

*Primary Examiner*—Mark A. Osele
(74) *Attorney, Agent, or Firm*—Finnegan, Henderson, Farabow, Garrett & Dunner L.L.P.

(57) ABSTRACT

A tape feeder for a part mounter including a guide frame into which first through third guide portions and a stripper are incorporated, a driving motor installed on the rear surface of the guide frame, first through third gears for transmitting the power of the driving motor, a sprocket coaxially installed on the third gear, the sprocket having teeth formed on the outer circumferential surface to be inserted into grooves formed on the tape having parts attached thereto and a plurality of slots formed along the circumference of the sprocket, a cover take-up apparatus assembly having a first pulley installed on one gear among the first and second gears, a belt hung on the first pulley, a second pulley which rotates by a driving force transmitted via the belt, and a take-up reel installed coaxially with respect to the second pulley, a cover tension apparatus assembly having an axle gear interlocked with the third gear, a peel roller which is installed coaxially with the axle gear and rotates, and a pinch roller which can rotate in contact with the peel roller, a sensor installed on the upper surface of the frame guide for sensing the nozzle of a robot for sucking parts, a detecting sensor for emitting light through the plurality of slots formed on the sprocket or sensing the light, and an indexing apparatus. The tape feeder becomes thin, can supply many parts, and secures accurate indexing.

7 Claims, 11 Drawing Sheets

TAPE FEEDER FOR COMPONENT PART MOUNTER

BACKGROUND OF THE INVENTION

1. Field of the Invention

The present invention relates to a tape feeder for a part mounter, and more particularly, to a tape feeder for a part mounter which can supply electronic parts at compact density and is improved in its indexing function.

2. Description of the Related Art

A typical part mounter is automated equipment used to mount electronic parts such as a semiconductor chip on a printed circuit board. This part mounter supplies component parts in various ways and mounts the parts on a printed circuit board using a suction nozzle which is operated by a robot. The manner of supplying parts varies according to operating conditions and the characteristics of the parts. For example, large parts are supplied by being carried on a tray but small parts do not require a tray. In particular, very small parts are frequently lost or damaged during mounting, and thus require a special tape feeder.

A tape feeder uses a tape reel where parts are attached at predetermined intervals on a tape. In order for the tape feeder to supply parts, a tape must be released from the reel, and a cover must be removed from parts attached to the tape. A suction nozzle of a robot absorbs the parts attached to the tape from which the cover has been removed, thereby separating the parts from the tape and moving the separated parts to certain positions on the printed circuit board.

FIG. 1 is an exploded perspective view of a typical tape feeder for a part mounter.

Referring to FIG. 1, the tape feeder includes a guide frame 11, a front cover 12 installed on the front surface of the guide frame 11, and a back cover 13 which covers the rear surface of the guide frame 11. The front and rear surfaces of the guide frame 11 have various parts for helping the tape feeder function. A portion of the guide frame 11 is cut away, and a driving motor 16 is installed in the open portion. A worm gear 17 is installed around the rotation shaft of the driving motor 16. A peel roller 18 and a pinch roller 19 are installed in such a manner that they come into contact with each other. An axle gear 23 is installed on the rear surface of the guide frame 11 coaxially with respect to the peel roller 18. A gear train comprised of a plurality of gears 17, 27, 281 29 and 23 (see FIG. 2) is installed on the rear surface of the guide frame 11 and thus transfer the rotation driving force of the motor 16 to the axle gear 23.

A take-up reel 24 is formed on the front surface of the guide frame 11. The take-up reel 24 is also rotated by receiving the driving force of the driving motor 16. A cover on a tape to which parts are attached is wound around the take-up reel 24. That is, after the cover is separated from the tape, it is wound around the takeup reel 24.

A shield 14 covering the rear surface of the guide frame 11, and a printed circuit board 15 having various electronic parts formed thereon are interposed between the guide frame 11 and the back cover 13.

A sensor (not shown) is installed on the upper portion 22 of a stripper 20 on the guide frame 11. The sensor senses arrival of a part at a suction position, and accordingly, the suction nozzle separates parts from the tape and transfers them to certain positions. The stripper 20 is installed on the upper portion of the guide frame 11 by being elastically supported by a stabilizer spring 21. One end of a compression spring 21' is supported by the lateral surface of the stripper 20, and the other end thereof is inserted into a boss (not shown) formed on the guide frame 11.

Some parts of upper portion of the front cover 12 is cut out to avoid collision with the stripper 20 when the front cover 12 is installed on the guide frame 11. A magnified view of the front cover 12 is shown in FIG. 5. That is, the stripper 20 is separately manufactured, and part of the upper portion of the front cover 12 is cut out as shown in FIG. 1 to install the stripper 20 on the upper lateral portion of the guide frame 11.

FIG. 2 is an exploded perspective view of the rear surface of the guide frame 11.

Referring to FIG. 2, a pulley 25 is installed on the rear surface of the guide frame 11, and first, second and third gears 27, 28 and 29 are installed in mesh with each other thereon. The third gear 29 is engaged with the axle gear 23. The worm gear 17 of the motor 16 shown in FIG. 1 is engaged with the first gear 27. A pulley (not shown) around which a belt 26 is to be wound is installed on the first gear 27. The belt 26 is also wounded around the pulley 25. The pulley 25 is installed coaxially with respect to the take-up reel 24 (see FIG. 1) installed on the front surface of the guide frame 11. The axle gear 23 is installed coaxially with respect to the peel roller 18 (see FIG. 1). Accordingly, the rotating force of the motor 16 rotates the take-up reel 24 through the first gear 27, the belt 26 and the pulley 25, and rotates the axle gear 23 through the first through third gears 27 through 29 to thereby rotate the peel roller 18. Reference numeral 31 is a lever. The lever 31 is installed to be capable of being pivoted while receiving an elastic force from a spring 33, A lower end 31a of the lever 31 is fit into a groove on the mounting portion of an unshown chip mounter, thus constantly positioning the entire part feeder on the chip mounter.

FIG. 3 is a schematic exploded perspective view of the first through third gears and a sprocket 32.

Referring to FIG. 3, the sprocket 32 is coaxially installed on the third gear 29. The sprocket 32 is shaped with a plurality of saw teeth 41 and a plurality of slots 42 around the circumference as shown in FIG. 4. The saw teeth 41 can be seen on the front side of the guide frame 11 through a cut-off portion of the guide frame 11, and the saw teeth 41 of the sprocket 32 seen through the guide frame 11 lies under the stripper 20 shown in FIG. 1. The saw teeth 41 of the sprocket 32 are inserted into grooves formed on a tape, and accordingly, when the sprocket 32 rotates, the tape is released from the reel and moves forward at predetermined pitches. To be more specific, a plurality of holes are formed along the edge of the tape onto which parts are attached, and the saw teeth 41 of the sprocket 32 are inserted into these holes, and the tape moves forward along a predetermined path by the rotation of the sprocket 32. Also, a light emitting sensor (not shown) to be described later is installed, and light emitted from the light emitting sensor passes through the slots 42 of the sprocket 32. That is, a light receiving sensor (not shown) senses whether the light from the light emitting sensor passes through the slots 42 or is blocked by portions other than the slots, whereby the rotation pitch of the sprocket 32 can be determined.

FIG. 6 shows the above-described gears and sensors.

Referring to FIG. 6, an encoder 61 is installed in front of the rotation shaft of the worm gear 17, and a first sensor 62a for sensing rotation of the encoder 61 is installed. A second sensor 62b for sensing rotation of the sprocket 32 described referring to FIG. 4 is installed. The first and second sensors 62a and 62b sense the rotations of the worm gear 17 and the sprocket 32 and transmit corresponding signals to a controller 63, and the controller 63 controls the driving of the motor in response to the signals. Reference numeral 64 represents a part of the traveling path of a tape onto which parts are attached, and reference numeral 65 represents a cover separated from the tape. The cover 65 is wound around the take-up reel 24. In the circle indicated by reference character A, the encoder 61 viewed from the right side of FIG. 6 is shown.

Referring to FIGS. 1 and 6, a tape having parts attached thereto reaches a portion where the stripper 20 is installed, along a predetermined path of a tape feeder. The tape is pressed between the compression spring 21' and a slanted surface contacting the compression spring 21'. A slot is formed through the stripper 20, and a cover covering parts is removed from a parts supply tape through the slot. The cover is inserted between the peel roller 18 and the pinch roller 19 and thus removed from the tape by tension provided from these rollers, and again moves to the take-up reel 24 along a predetermined path and is wound thereby. The sensor (not shown) installed on the portion 22 senses arrival of the parts on the tape at predetermined positions, and accordingly, a part suction nozzle absorbs the parts from the tape and transfers them. The tape 64 with parts removed is again moved along a predetermined path and released to the outside of the tape feeder.

Here, the tape 64 moves along a predetermined path according to a predetermined indexing function, and this movement of the tape 64 is made by the operations of the encoder 61, sprocket 32, and sensors 62a and 62b shown in FIG. 6. That is, when an indexing pitch is determined by detection of an optical signal transmitted through the slots 42 of the sprocket 32 by the second sensor 62b, the first sensor 62a calculates an optical signal detected by the encoder 61 to stop the driving motor 16. In this way, the indexing function is accomplished.

This general tape feeder has the following problems.

First, many parts cannot be attached to the tape because of the relatively large minimum rotation pitch of the sprocket 32. The indexing pitch of the sprocket 32 depends on the slots 42 formed through the sprocket 32, and the very wide interval between adjacent slots 42 increases the rotation pitch of the sprocket 32. Accordingly, the number of parts that can be attached is reduced. Also, since parts can be mounted only on one surface of the printed circuit board 15 shown in FIG. 2, the tape feeder overall becomes thicker. That is, since parts are mounted only on the opposite surface of a surface of the printed circuit board 15 facing the shield 14, the parts are installed on a restricted space, thereby increasing the thickness of the tape feeder.

Since the stripper 20 is formed as a separate part, the number of parts is increased, and the manufacture of the tape feeder is not easy. As shown in FIG. 1, the stripper 20 is separately manufactured of plastic and attached to the guide frame 11. The stripper 20 strips off the cover on the tape, and simultaneously prevents the parts from being removed from the tape. However, the stripper 20 is manufactured of plastic as a separate part, so that the durability is weak and manufacture and assembly of the part are not easy Also, assembly of the compression spring 21' is difficult. In other words, since one end of the compression spring 21' is installed on the guide frame 11 and the other end thereof is hung on the stripper 20, the compression spring 21' must be assembled simultaneously with the stripper 20, thereby resulting in difficult assembly.

Furthermore, it is difficult for the driving motor to perform indexing. The driving motor 16 is electrically controlled in response to the signal of the controller 63, but the inertia of an operating portion of the driving motor 16 cannot be controlled in this manner. Therefore, in practice, the accuracy of indexing is degraded with an increase in the number of indexing operations.

SUMMARY OF THE INVENTION

To solve the above problems, it is an object of the present invention to provide a tape feeder for a part mounter capable of installing many parts within a restricted space.

It is another object of the present invention to provide a tape feeder for a part mounter capable of enhancing the accuracy of indexing.

It is still another object of the present invention to provide a tape feeder for a part mounter capable of being easily manufactured.

Accordingly, to achieve the object, there is provided a tape feeder for a part mounter comprising: a frame including a stripper for stripping a cover from a tape having parts attached thereto and a guide portion for guiding parts on the tape to suction positions; a driving motor installed on the rear surface of the frame, and a gear train where gears are interlocked with each other so as to be rotated by the driving motor; a sprocket coaxially installed on one gear in the gear train, the sprocket having teeth formed on the outer circumferential surface to be inserted into holes formed on the tape having parts attached thereto and a plurality of slots formed along the circumference of the sprocket; a cover take-up assembly having a first pulley installed on another gear in the gear train, a belt hung on the first pulley, a second pulley which rotates by a driving force transmitted via the belt, and a take-up reel installed coaxially with respect to the second pulley; a cover tensioning assembly having an axle gear engaged with the gear train, a peel roller which is installed coaxially with the axle gear and rotates, and a pinch roller which can rotated in contact with the peel roller; and a sensor installed on the upper surface of the frame for sensing arrival of parts at suction positions, and a detecting sensor corresponding to the plurality of slots formed on the sprocket.

Preferably, the tape feeder for a part mounter further comprises a shield installed on the rear surface of the frame: and a print circuit board having parts mounted thereon, wherein predetermined portions of the shield and the frame are open such that parts are mounted on both side surfaces of the printed circuit board, Preferably, the slots of the sprocket are formed so that the minimum feed pitch of the tape is 2 mm.

Preferably, the tape feeder further comprises a compression spring including two ends for pressing down on a slanted surface formed on the frame so that the tape having parts attached thereto can be transferred, wherein each of said two ends of the compression spring are coupled to bosses formed on the guide frame.

It is preferable that the tape feeder for a part mounter further comprises: an indexing apparatus having a ratchet coaxially installed on the sprocket and a stop pawl interlocked with the ratchet.

Preferably, the stop pawl in the indexing apparatus is rotatably installed, and elastically deflected in one direction by a spring.

Preferably, the stop pawl in the indexing apparatus is installed capable of being reciprocated by the driving of a solenoid.

It is preferable that the guide portion comprises a first guide portion having a flat upper surface and a convex lower surface; a second guide portion having a convexly-curved upper surface such that a clearance through which the parts-attached tape passes is formed between the curved upper surface of the second guide portion and the flat upper surface of the first guide portion; and a third guide portion having a concave lower surface such that a clearance for passing a parts-detached tape is formed between the concave lower surface of the third guide portion and the convex upper surface of the second guide portion, and the stripper extends in the lateral direction of the frame such that a clearance for passing the cover is formed between the stripper and the flat upper surface of the first guide portion.

BRIEF DESCRIPTION OF THE DRAWINGS

The above objects and advantages of the present invention will become more apparent by describing in detail a preferred embodiment thereof with reference to the attached drawings in which.

DESCRIPTION OF THE PREFERRED EMBODIMENT

Figure 1:
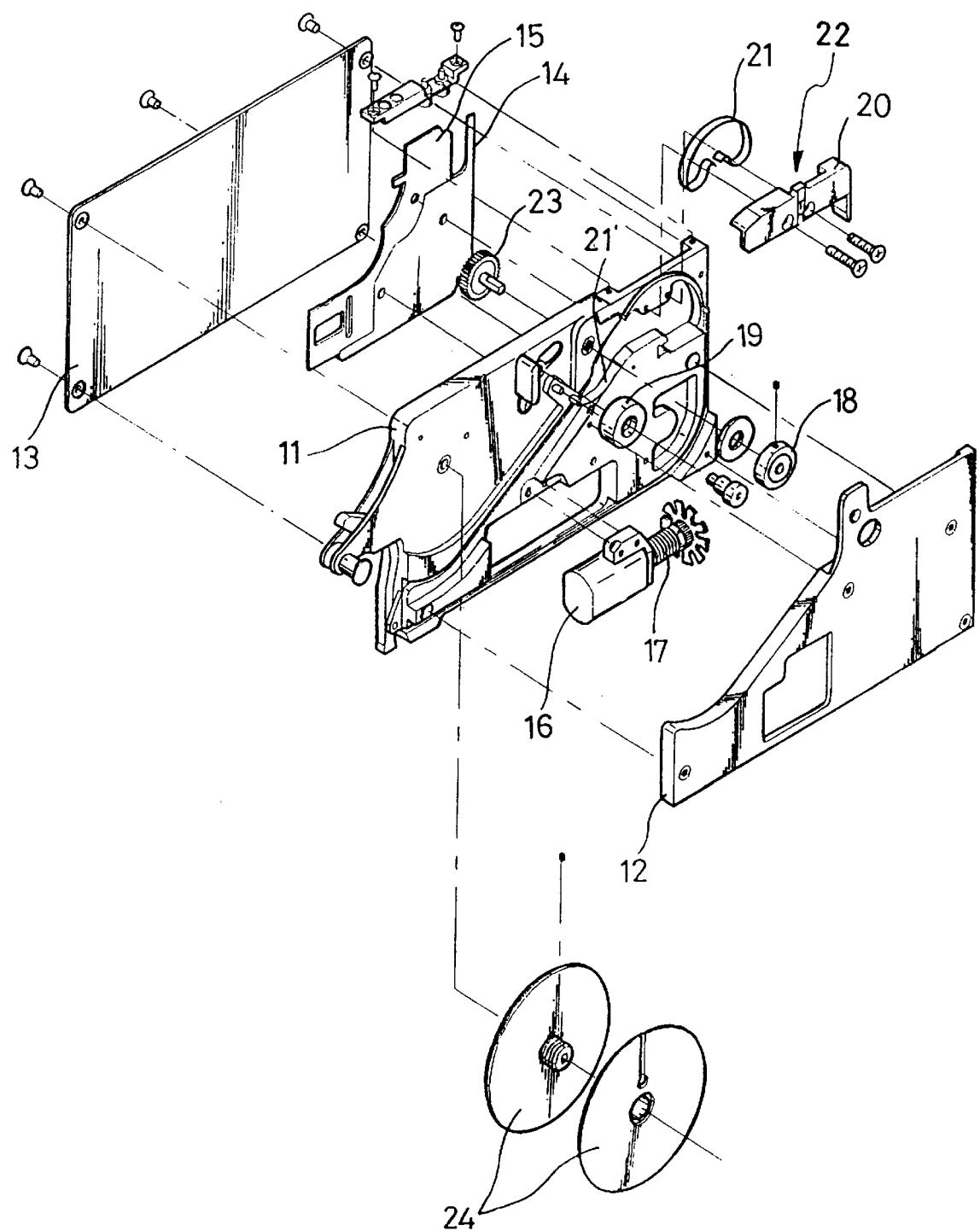
FIG. 1 is a schematic exploded perspective view of a general tape feeder for a part mounter.
Figure 2:
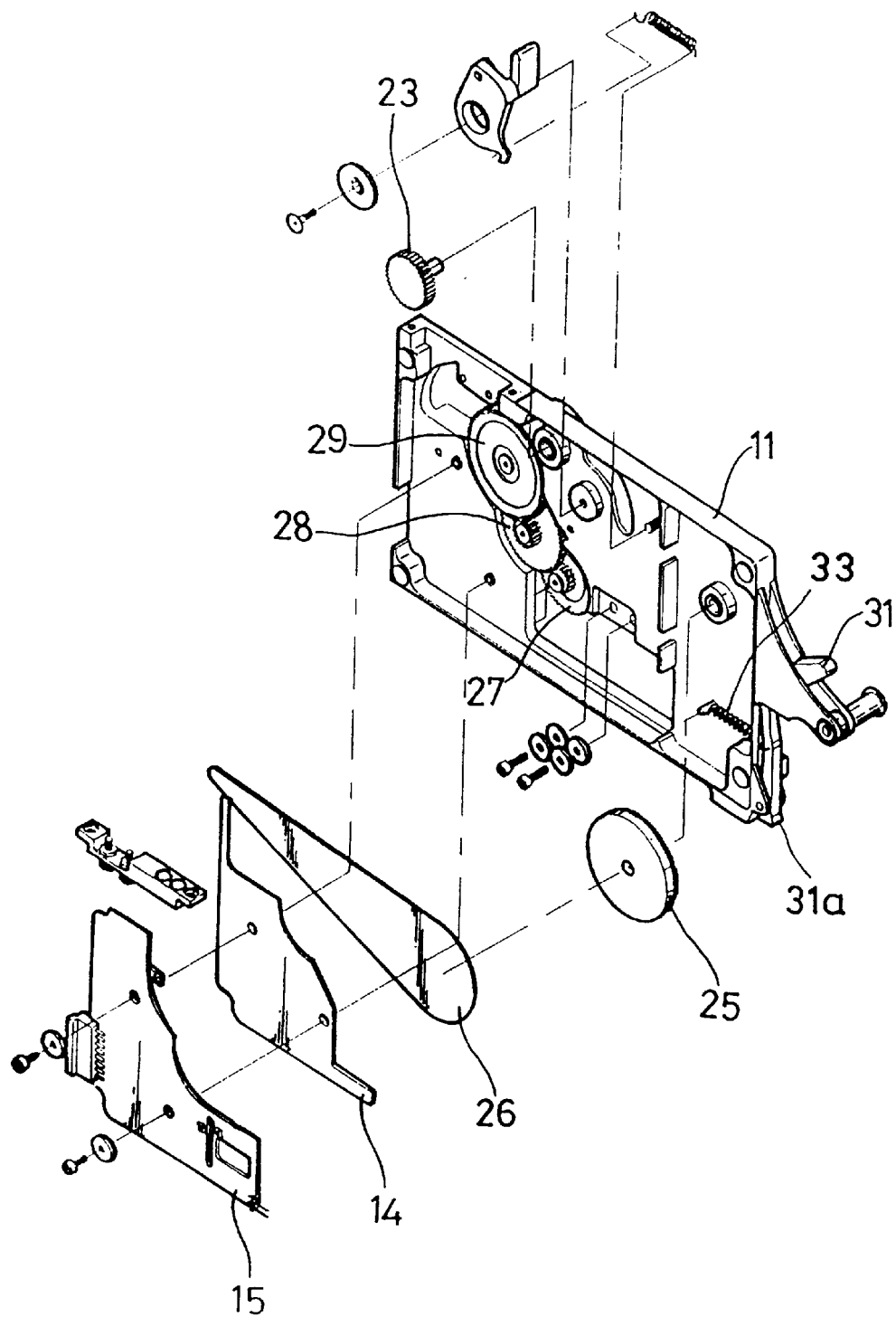
FIG. 2 is a schematic exploded perspective view of the rear surface of the guide frame in the tape feeder of FIG. 1.
Figure 3:
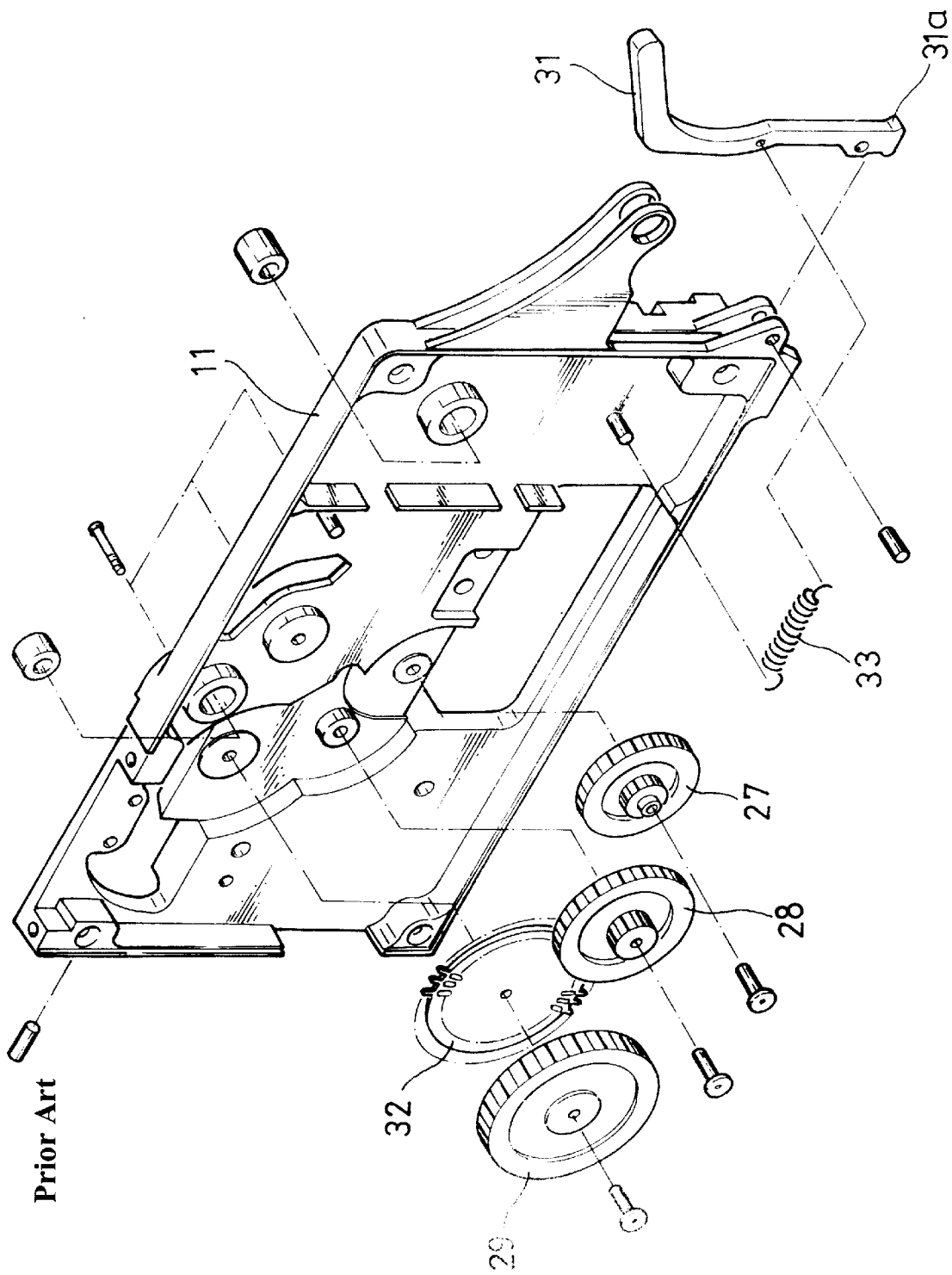
FIG. 3 is a schematic exploded perspective view of the gear train of the tape feeder shown in FIG. 2.
Figure 7:
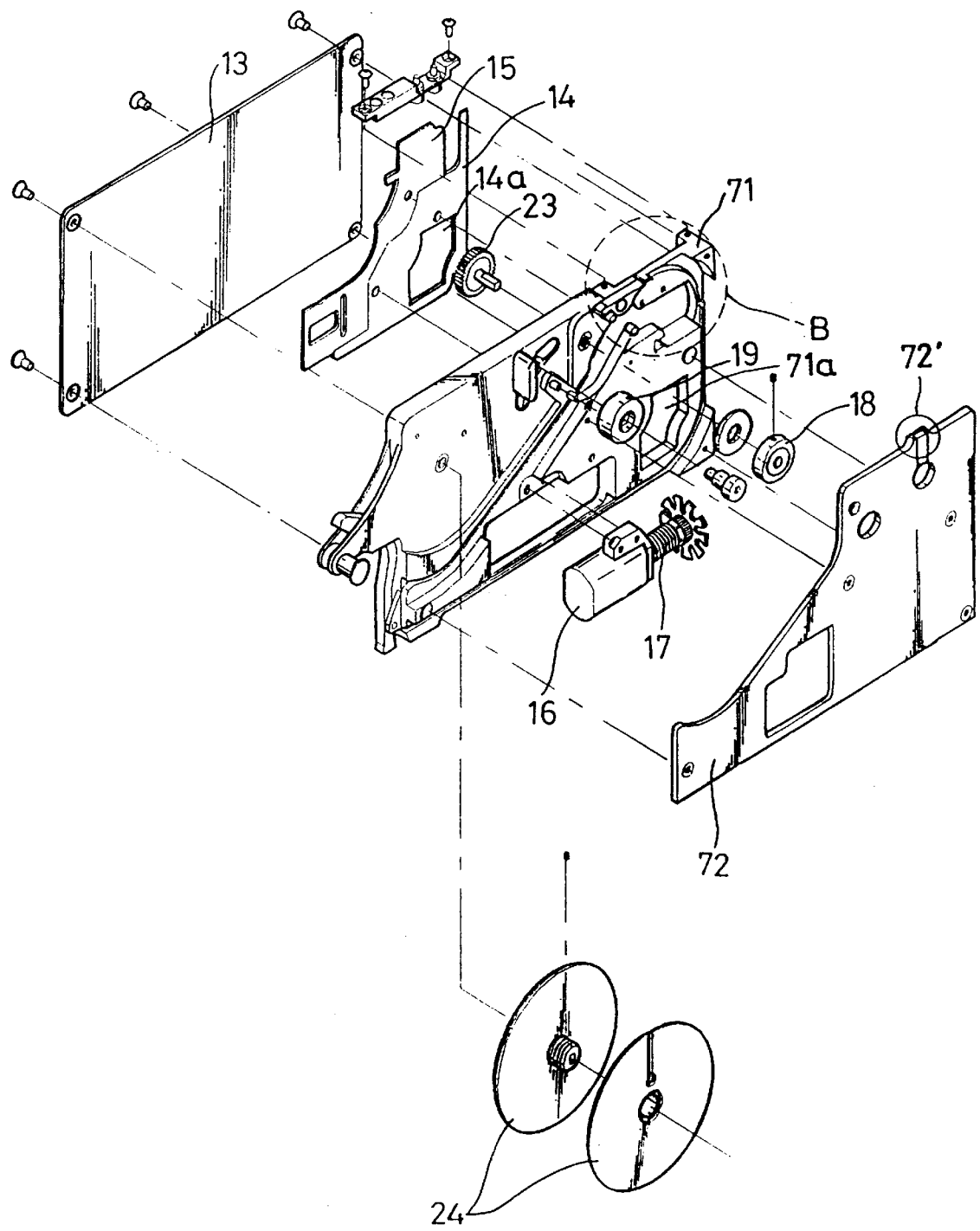
FIG. 7 is a schematic exploded perspective view of a tape feeder for a part mounter according to the present invention.
Figure 8:
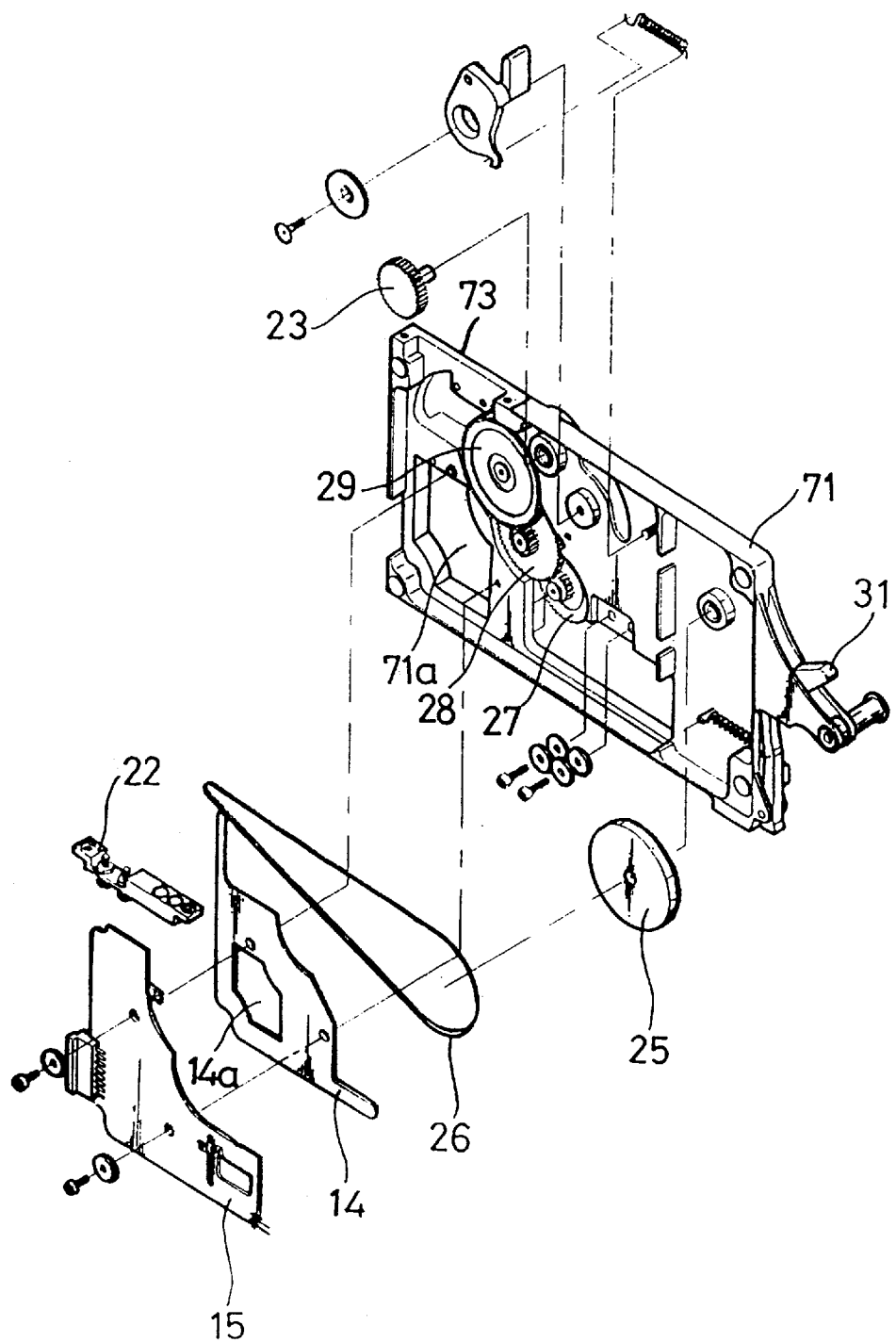
FIG. 8 is a schematic exploded perspective view of the rear surface of the guide frame shown in FIG. 6.

FIGS. 7 and 8 are schematic exploded perspective views of a tape feeder for a part mounter according to the present invention. Some structures of the tape feeder for a part mounter according to the present invention are the same as those of the general tape feeder shown in FIGS. 1 and 2. The same components as those in FIGS. 1 and 2 are represented by the same reference numerals.

Referring to FIG. 7, the tape feeder includes a guide frame 71, a front cover 72 installed on the front surface of the guide frame 71, and a back cover 13 which covers the rear surface of the guide frame 71. A portion of the guide frame 71 is cut away, and a driving motor 16 is installed on the open portion. A worm gear 17 is installed around the rotation shaft of the driving motor 16. A peel roller 18 and a pinch roller 19 are installed in such a manner that they come into contact with each other.

An axle gear 23 is installed on the rear surface of the guide frame 71 coaxially with respect to the peel roller 18. A gear train is installed on the rear surface of the guide frame 71 and thus transmit the driving force of the motor 16 to the axle gear 23. A take-up reel 24 is also installed on the front surface of the guide frame 71. The take-up reel 24 is also rotated by receiving the driving force of the driving motor 16. A shield 14 covering the rear surface of the guide frame 71, and a printed circuit board 15 having various electronic parts formed thereon are interposed between the guide frame 71 and the back cover 13. A sensor (not shown) is installed on the upper portion 72' of the front cover 72. The sensor senses the arrival of parts at suction positions.

FIG. 8 is a schematic exploded perspective view of the rear surface of the guide frame 71.

Referring to FIG. 8, a pulley 25 is installed on the rear surface of the guide frame 71, and first, second and third gears 27, 28 and 29 are installed in mesh with each other thereon. The third gear 29 is engaged with the axle gear 23. A pulley (not shown) around which a belt 26 is to be wound is installed on the first gear 27. The belt 26 is also wound around the pulley 25. The pulley 25 is installed coaxially with respect to the take-up reel 24 installed on the front surface of the guide frame 71. The axle gear 23 is installed coaxially with respect to the peel roller 18. Accordingly, the rotating force of the motor 16 is transmitted to the take-up reel 24 via the first gear 27. The belt 26 and the pulley 25 and thus rotates the take-up reel 24. Also, the rotating force of the motor 16 is transmitted to the axle gear 23 via the first through third gears 27 through 29 and thus rotates the axle gear 23, thereby rotating the peel roller 18. Reference numeral 31 is a lever.

Figure 4:
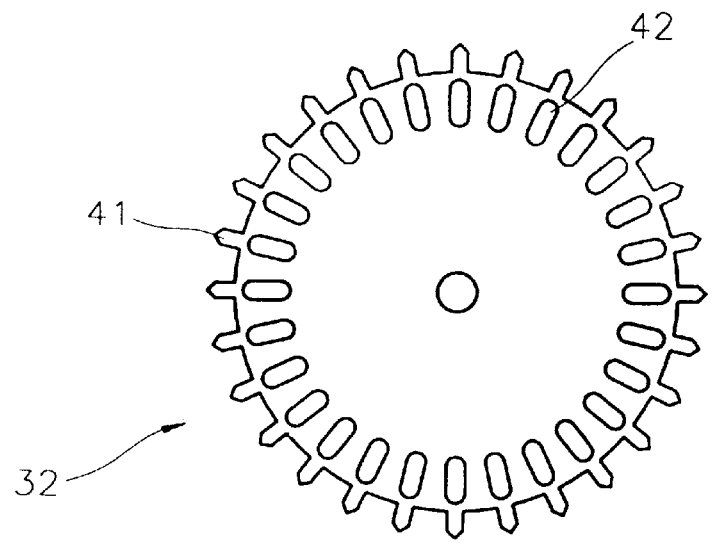
FIG. 4 is a front view of the sprocket shown in FIG. 2.
Figure 10:
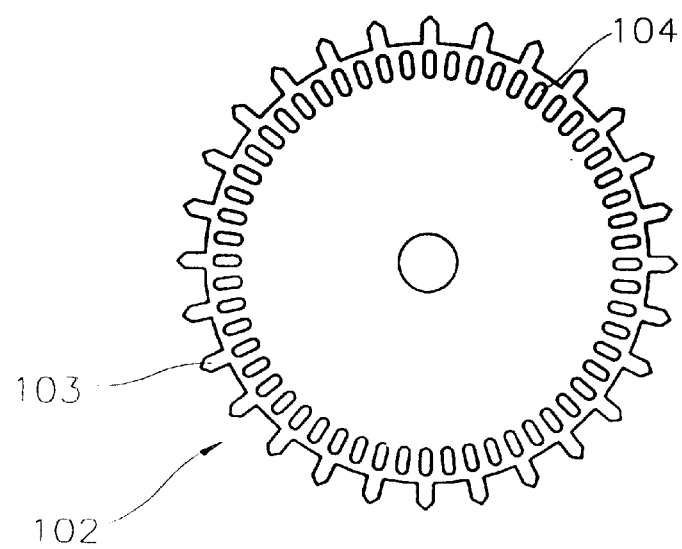
FIG. 10 is a front view of a sprocket installed in a tape feeder according to the present invention.
Figure 5:
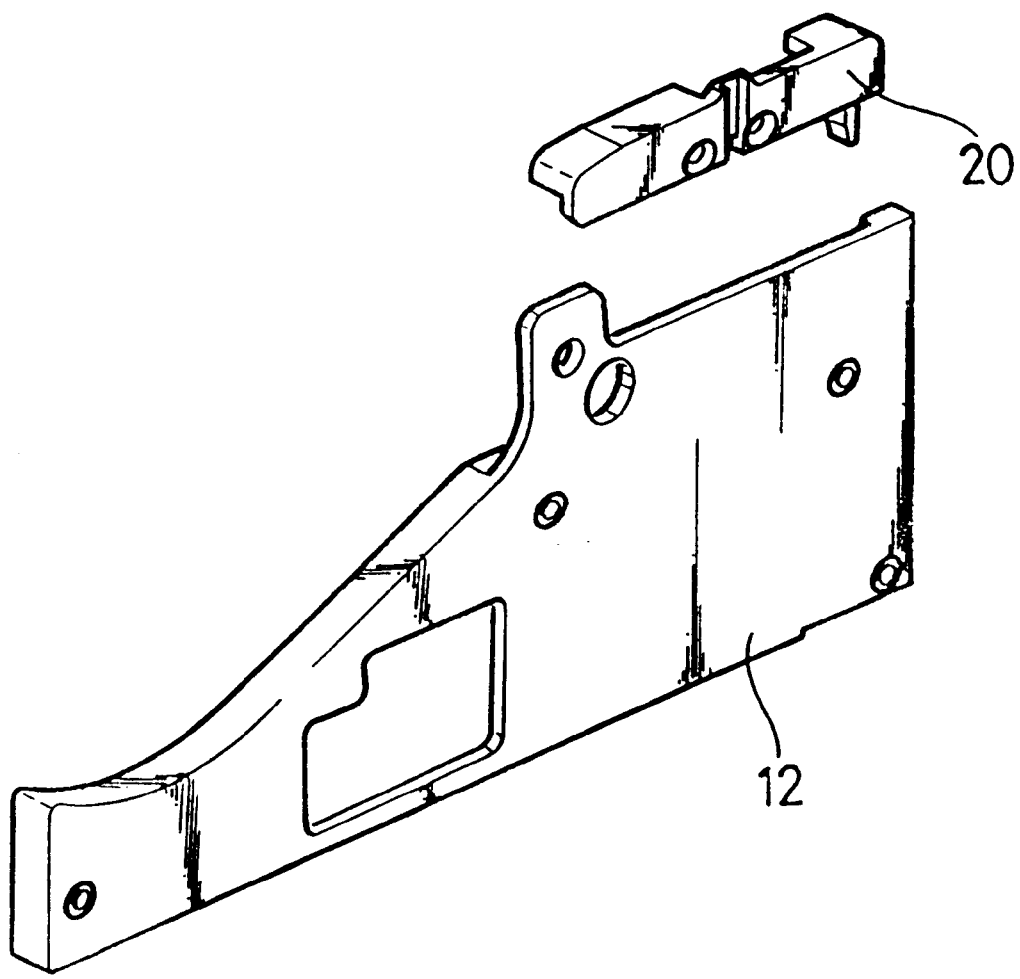
FIG. 5 is a perspective view of the front cover and the stripper shown in FIG. 1.

According to an aspect of the present invention, a sprocket being coaxially installed on the third gear 29 has a smaller rotation feed pitch than that of the prior art. The sprocket is represented by reference numeral 102 in the plan view of FIG. 10, and has a plurality of saw teeth 103 and a plurality of densely-spaced slots 104 around the circumference of the sprocket as shown in FIG. 10. In comparing this sprocket with the sprocket 32 in the general tape feeder shown in FIG. 4, the minimum feed pitch of a tape in the prior art is 4 mm, while the minimum feed pitch of a tape according to the present invention is reduced to 2 mm. Here, the minimum feed pitch of a tape is halved due to a 50% decrease in the intervals between adjacent slots 104.

According to another aspect of the present invention, in order for the parts to be mounted on both surfaces of the board 15, an open portion 14a is formed through the shield 14, and an open portion 71a is also formed through the guide frame 71. That is, since parts are mounted on the surface of the circuit board 15 through the open portions 14a and 17a, a larger number of thick parts can be mounted on both surfaces of the board 15, and the total thickness of the tape feeder can be reduced.

According to still another aspect of the present invention, a stripper for guiding a tape onto which parts are attached and stripping the tape off its cover is incorporated into the guide frame 71. This aspect is shown in FIG. 9 being a magnified perspective view of the portion B in FIG. 7.

Figure 9:
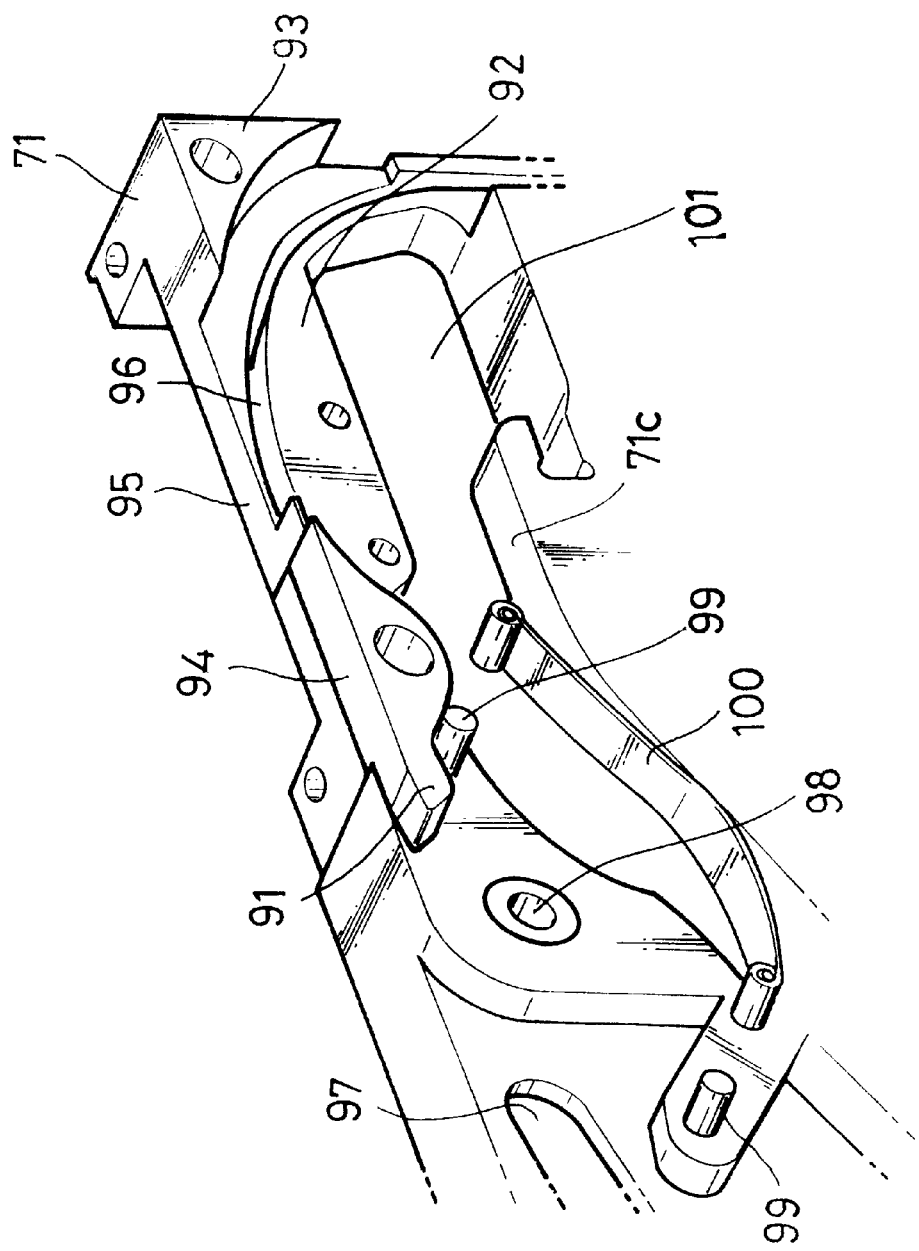
FIG. 9 is a magnified perspective view of the portion 8 in FIG. 7.

Referring to FIG. 9, first, second and third guide portions 91, 92 and 93 are installed on the upper edge of the guide frame 71. The first guide portion 91 has a plane upper surface and a lower surface shaped of a curve whose center is convex. The second guide portion 92 has an upper surface which is curved, and a lower surface facing an open portion 101 of the guide frame 71. As described above, the teeth 103 of the sprocket 102 of FIG. 10 are exposed through the open portion 101 of the guide frame 71. The teeth 103 are inserted into holes formed on a tape (not shown), thereby moving the tape. A clearance through which a tape travels is formed between the curved upper surface of the second guide portion 92 and a concave surface of the lower surface of the first guide portion 91.

The third guide portion 93 is formed on the upper portion of the guide frame 71, and forms a concave surface facing the upper curved surface of the second guide portion 92. A clearance through which a tape travels is formed between the curved surfaces of the third and second guide portions 93 and 92.

A stripper 95 is formed on the upper surface of the guide frame 71, is shaped of a thin flat plate extending in the lateral direction of the guide frame 71. The stripper 95 is overlapped with the end portion of the upper plane surface 94 of the first guide portion 91, such that a clearance is formed between the lower surface of the stripper 95 and the upper plane surface of the first guide portion 91.

The rolled ends of a compression spring 100 are coupled to bosses 99 and 99'. However, in the prior art, one end of a compression spring is coupled to a boss, and the other end thereof is supported by a stripper. The coupling manner according to the present invention improves the convenience of assembly. A tape having parts attached thereto travels between the compression spring 100 and a slanted surface 71c by being pressed by the elasticity of the compression spring 100. The compression spring 100 prevents the tape from being loosened when moving by the sprocket 102.

Figure 6:
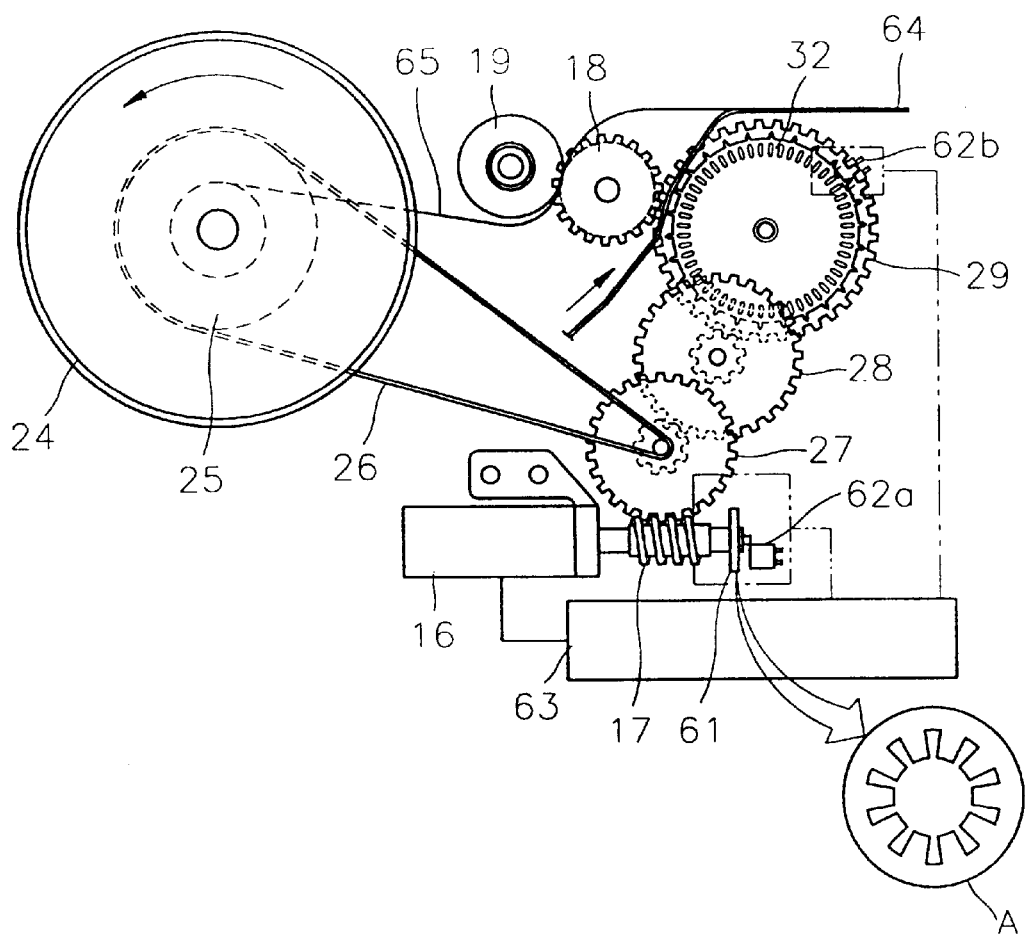
FIG. 6 is an extracted view of some components of the tape feeder of FIG. 1.

Reference numeral 97 is a hole for passing the rotation shaft of the pinch roller 19, and reference numeral 98 is a hole for passing the rotation shaft of the peel roller 18 of FIG. 6.

On the guide frame 71 as shown in FIG. 9, the parts-attached tape travels through the clearance formed between the first and second guide portions 91 and 92, and then travels along the upper surface 96 of the second guide portion 92, and then travels between the upper surface of the second guide portion 92 and the lower surface of the third guide 93.

While the tape travels in this way, separation of a cover from the tape is achieved between the stripper 95 and the first guide portion 91. That is, the cover passes through the lower surface of the stripper 95 and the upper plate surface 94 of the first guide portion 91, and is pulled by the tension provided by the pinch roller 19 and the peel roller 18 and removed from the tape. The cover separated from the tape is wound around the take-up reel 24 shown in FIG. 7.

When the cover is removed from the tape, parts attached to the tape are exposed. The exposed parts are sucked up by a suction nozzle from the upper curved surface 96 of the second guide portion 92 and detached from the tape. The tape with its cover removed and parts detached passes through the space between the second and third guide portions 92 and 93, and finally released to the outside of the tape feeder.

According to yet another aspect of the present invention, the indexing operation of the tape feeder can be mechanically controlled as well as being controlled by the driving of the motor through a controller. This mechanical control system does not degrade the accuracy of the indexing operation, even when the indexing operation is repeated.

Figure 11:
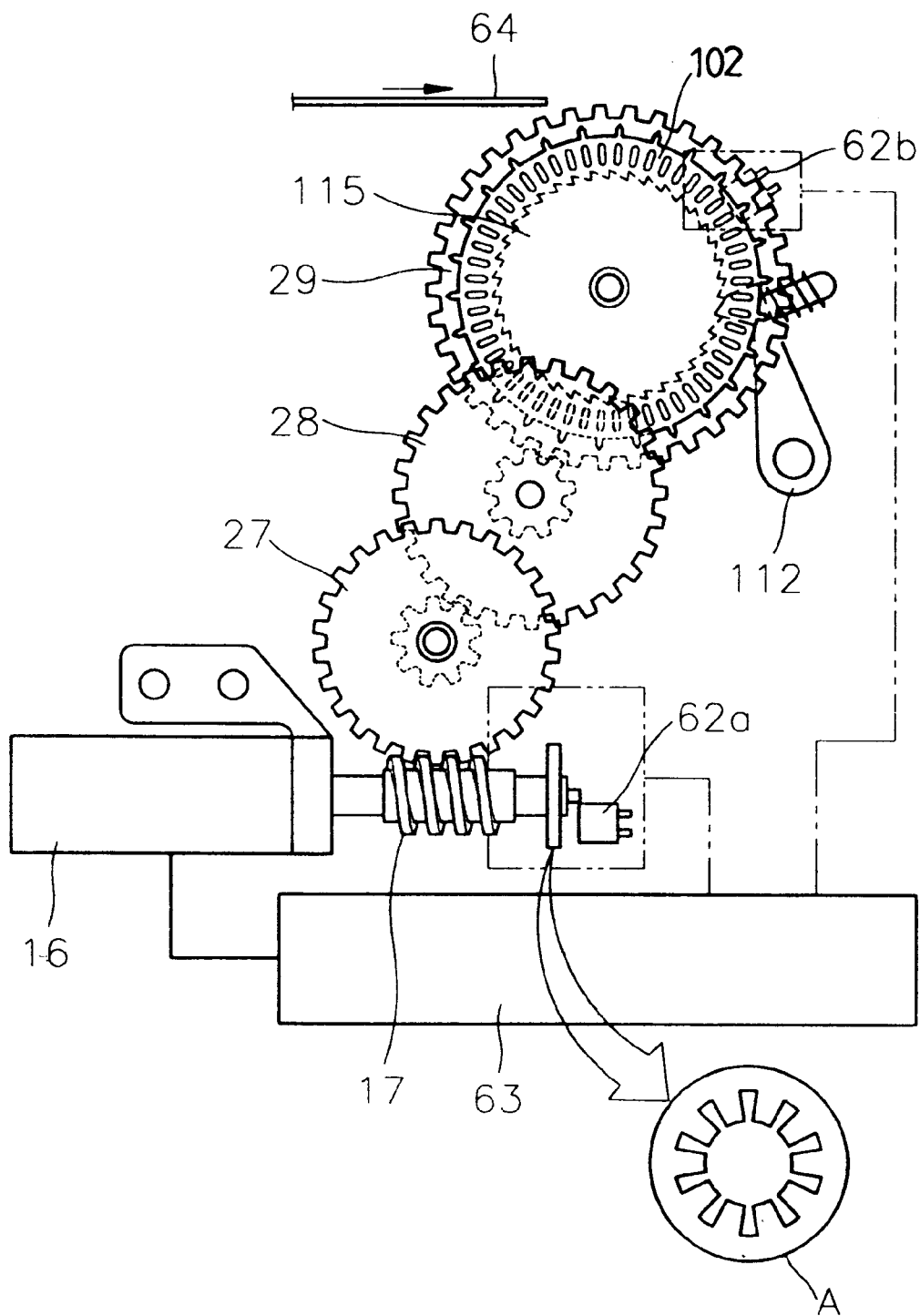
FIG. 11 is an extracted view of some components of a tape feeder according to the present invention.

FIG. 11 is a schematic view illustrating an indexing apparatus according to an aspect of the present invention. Parts of FIG. 11 are the same as FIG. 6, so like reference numerals will not be described again.

Referring to FIG. 11, a ratchet 115 is coupled to the third gear 29 coaxially with the sprocket 102. The ratchet 115 rotates according to the rotation of the third gear 29. The ratchet 115 is engaged with a spring-deflected stop pawl 112 as shown in FIGS. 11 and 12, or with a stop pawl 131 which can be controllably reciprocated by solenoid as shown in FIG. 13.

Figure 12:
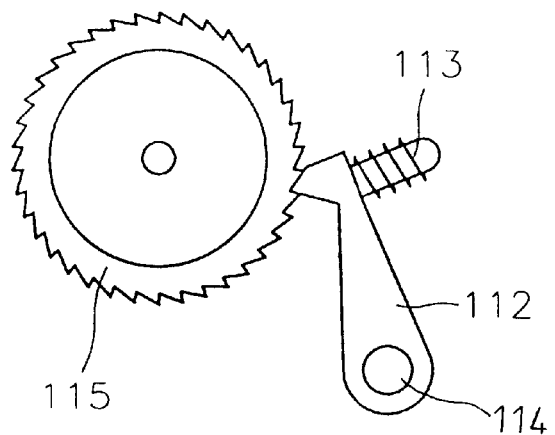
FIGS. 12 and 13 show examples of an indexing apparatus in a tape feeder according to the present invention.

FIG. 12 shows only the ratchet and the stop pawl extracted from the components shown in FIG. 11. As shown in FIG. 12, the rotatably-installed stop pawl 112 is engaged with the teeth of the ratchet 115. The pawl 112 is installed so as to rotate around a rotation shaft 114, and receives elasticity in one direction from the spring 113. Accordingly, the ratchet 115 is restricted by the stop pawl 112 during rotation, and thus prevented from rotating over an indexing pitch due to inertia.

Figure 13:
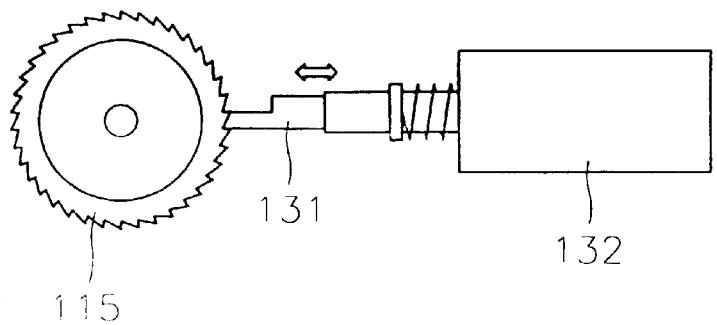

FIG. 13 shows another example of an indexing apparatus according to the present invention. Referring to FIG. 13, the stop pawl 131 is controllably reciprocated by a solenoid 132. When the stop pawl 131 is engaged with the ratchet 115, rotation of the ratchet 115 is stopped. The solenoid 132 is controlled by the controller 63 shown in FIG. 11.

The above-described mechanical indexing pitch control method can be applied simultaneously with the electronic control method with respect to the driving motor 16.

The operation of the tape feeder for a part mounter according to the present invention was partially described above, but will now be described again in brief.

A tape with parts attached covered by a cover enters between the first and second guide portions 91 and 92 through a guide slot formed through the tape feeder while being pressed between the compression spring 100 and the slanted surface 71c. The teeth 103 of the sprocket 102 are inserted into holes formed on the tape, and the sprocket 102 receives the driving force of the motor 16 via the worm gear 17, and the first through third gears 27 through 29, thereby transferring the tape is accomplished.

Removal of the cover from the tape with parts attached is accomplished by passing the cover between the upper surface of the first guide portion 91 and the stripper 95 and moving the cover between the peel roller 18 and the pinch roller 19, The separated cover is wound around the take-up reel 24. The peel roller 18 can rotate by receiving the rotating force of the motor 16 via the first through third gears 27 through 29 and the axle gear 23. Also, the take-up reel 24 is rotated by receiving the rotation of the belt 26 wound around a pulley rotating with the first gear 27 via the pulley 25.

When the tape with cover removed reaches the curved surface 96 of the second guide portion 92, a sensor (not shown) installed on the upper surface 72' of the front cover 72 senses arrival of parts at suction positions. In response to a signal sensed by the sensor (not shown), a suction nozzle (not shown) moves to suction positions set on the upper surface 96 of the second guide portion 92, and detaches the parts from the tape. The tape with its parts removed and stripped off the cover is released to the outside of the tape feeder along a space between the second and third guide portions 92 and 93.

The tape feeder for a part mounter according to the present invention can be easily manufactured and improved in durability, and can supply many parts although it is relatively thin. That is, many parts can be attached to a tape and supplied due to a decrease in the minimum rotation pitch of a sprocket, the number of parts is reduced due to incorporation of a stripper for stripping the tape off a cover and corresponding guide portions in one body, and the tape feeder becomes thin since parts can be mounted on both surfaces of a printed board. Also, the tape feeder can be assembled more conveniently since both ends of the compression spring are coupled to bosses formed on the guide frame. Furthermore, accurate control of an indexing pitch is achieved.

While the present invention has been described with reference to an embodiment shown in the attached drawings, the embodiment is just an example. It will be understood by those skilled in the art that various modifications of the described embodiment may be made or other embodiments may be effected without departing from the spirit and scope of the invention as defined by the appended claims.

What is claimed is:

1. A tape feeder for a part mounter, comprising:

a frame including a stripper for stripping a cover from a tape having parts attached thereto and a guide portion for guiding parts on the tape to suction positions;

a driving motor installed on the rear surface of the frame, and a gear train where gears are engaged with each other so as to be rotated by the driving motor;

a sprocket coaxially installed on one gear in the gear train, the sprocket having teeth formed on the outer circumferential surface to be inserted into holes formed on the tape having parts attached thereto and a plurality of slots formed along the circumference of the sprocket;

a cover take-up assembly having a first pulley installed on another gear in the gear train, a belt hung on the first pulley, a second pulley which rotates by a driving force transmitted via the belt, and a take-up reel installed coaxially with respect to the second pulley;

a cover tensioning assembly having an axle gear engaged with the gear train, a peel roller which is installed coaxially with the axle gear and rotates, and a pinch roller which can rotate in contact with the peel roller;

a sensor installed on the upper surface of the frame for sensing arrival of parts at suction positions, and a detecting sensor corresponding to the plurality of slots formed on the sprocket;

an indexing apparatus having a ratchet coaxially installed on the sprocket and a stop pawl engaged with the ratchet;

a shield installed on the rear surface of the frame; and a print circuit board including two side surfaces and having parts mounted thereon, wherein predetermined portions of the shield and the frame are cut away such that parts are mounted on both side surfaces of the printed circuit board.

2. The tape feeder of claim 1, further comprising a compression spring including two ends for pressing down on a slanted surface formed on the frame so that the tape having parts attached thereto can be transferred, wherein each of said two ends of the compression spring are coupled to bosses formed on the guide frame.

3. The tape feeder of claim 1, wherein the stop pawl in the indexing apparatus is rotatably installed, and elastically deflected in one direction by a spring.

4. The tape feeder of claim 1, wherein the stop pawl in the indexing apparatus is installed such that it is capable of being reciprocated by the driving of a solenoid.

5. A tape feeder for a part mounter, comprising:

a frame including a stripper for stripping a cover from a tape having parts attached thereto and a guide portion for guiding parts on the tape to suction positions;

a driving motor installed on the rear surface of the frame, and a gear train where gears are engaged with each other so as to be rotated by the driving motor;

a sprocket coaxially installed on one gear in the gear train, the sprocket having teeth formed on the outer circumferential surface to be inserted into holes formed on the tape having parts attached thereto and a plurality of slots formed along the circumference of the sprocket;

a cover take-up assembly having a first pulley installed on another gear in the gear train, a belt hung on the first pulley, a second pulley which rotates by a driving force transmitted via the belt, and a take-up reel installed coaxially with respect to the second pulley;

a cover tensioning assembly having an axle gear engaged with the gear train, a peel roller which is installed coaxially with the axle gear and rotates, and a pinch roller which can rotate in contact with the peel roller;

a sensor installed on the upper surface of the frame for sensing arrival of parts at suction positions, and a detecting sensor corresponding to the plurality of slots formed on the sprocket; and an indexing apparatus having a ratchet coaxially installed on the sprocket and a stop pawl engaged with the ratchet, wherein the slots of the sprocket are formed so that the minimum feed pitch of the tape is 2 mm.

6. A tape feeder for a part mounter, comprising:

a frame including a stripper for stripping a cover from a tape having parts attached thereto and a guide portion for guiding parts on the tape to suction positions;

a driving motor installed on the rear surface of the frame, and a gear train where gears are engaged with each other so as to be rotated by the driving motor;

a sprocket coaxially installed on one gear in the gear train, the sprocket having teeth formed on the outer circumferential surface to be inserted into holes formed on the tape having parts attached thereto and a plurality of slots formed along the circumference of the sprocket;

a cover take-up assembly having a first pulley installed on another gear in the gear train, a belt hung on the first pulley, a second pulley which rotates by a driving force transmitted via the belt, and a take-up reel installed coaxially with respect to the second pulley;

a cover tensioning assembly having an axle gear engaged with the gear train, a peel roller which is installed coaxially with the axle gear and rotates, and a pinch roller which can rotate in contact with the peel roller;

a sensor installed on the upper surface of the frame for sensing arrival of parts at suction positions, and a detecting sensor corresponding to the plurality of slots formed on the sprocket; and an indexing apparatus having a ratchet coaxially installed on the sprocket and a stop pawl engaged with the ratchet, wherein the guide portion comprises a first guide portion having a flat upper surface and a convex lower surface; a second guide portion having a convexly-curved upper surface such that a clearance through which the parts-attached tape passes is formed between the curved upper surface of the second guide portion and the flat upper surface of the first guide portion; and a third guide portion having a concave lower surface such that a clearance for passing a parts-detached tape is formed between the concave lower surface of the third guide portion and the convex upper surface of the second guide portion, and the stripper extends in a lateral direction of the frame such that a clearance for passing the cover is formed between the stripper and the flat upper surface of the first guide portion.

7. A tape feeder for a part mounter, comprising:

a frame including a stripper for stripping a cover from a tape having parts attached thereto and a guide portion for guiding parts on the tape to suction positions;

a driving motor associated with a gear train, the gears being engaged with each other so as to be rotated by the driving motor;

a sprocket coaxially installed on a gear in the gear train, the sprocket having teeth configured to be inserted into holes formed on the tape having parts attached thereto and having a plurality of slots formed along the circumference of the sprocket; and a sensor installed on the upper surface of the frame for sensing arrival of parts at suction positions, and a detecting sensor corresponding to the plurality of slots formed on the sprocket, wherein the slots of the sprocket are formed so that the minimum feed pitch of the tape is 2 mm.

* * * * *